United States Patent
Li et al.

(10) Patent No.: US 7,268,463 B2
(45) Date of Patent: Sep. 11, 2007

(54) STRESS RELEASE MECHANISM IN MEMS DEVICE AND METHOD OF MAKING SAME

(75) Inventors: Gary G. Li, Gilbert, AZ (US); Jonathan Hale Hammond, Scottsdale, AZ (US); Daniel N. Koury, Jr., Mesa, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 128 days.

(21) Appl. No.: 11/192,874

(22) Filed: Jul. 28, 2005

(65) Prior Publication Data

US 2007/0024156 A1    Feb. 1, 2007

(51) Int. Cl.
*H02N 1/00* (2006.01)
(52) U.S. Cl. ............... 310/309; 73/514.32; 73/504.12
(58) Field of Classification Search ............... 310/309; 74/504.12, 514.18, 514.32, 514, 23; 216/6; 359/295, 224; 385/18; 73/504.12, 514.18, 73/514.32, 514, 23
See application file for complete search history.

(56) References Cited

U.S. PATENT DOCUMENTS

| | | | | |
|---|---|---|---|---|
| 5,350,189 A | * | 9/1994 | Tsuchitani et al. | 280/735 |
| 6,445,106 B1 | * | 9/2002 | Ma et al. | 310/309 |
| 6,494,096 B2 | * | 12/2002 | Sakai et al. | 73/514.32 |
| 6,771,001 B2 | * | 8/2004 | Mao et al. | 310/309 |
| 6,798,113 B2 | * | 9/2004 | Ives | 310/309 |
| 7,126,249 B2 | * | 10/2006 | Shimanouchi | 310/309 |
| 2004/0231421 A1 | * | 11/2004 | Yoshioka et al. | 73/514.32 |
| 2005/0019974 A1 | | 1/2005 | Lutz et al. | 438/52 |
| 2005/0185310 A1 | * | 8/2005 | Kurosawa | 359/900 |
| 2007/0024156 A1 | * | 2/2007 | Li et al. | 310/309 |

FOREIGN PATENT DOCUMENTS

JP    2004347475 A    12/2004

\* cited by examiner

*Primary Examiner*—Karl Tamai
(74) *Attorney, Agent, or Firm*—Ingrassia, Fisher & Lorenz

(57) ABSTRACT

MEMS devices (100) and methods for forming the devices have now been provided. In one exemplary embodiment, the MEMS device (100) comprises a substrate (106) having a surface, an electrode (128) having a first portion coupled to the substrate surface, and a second portion movably suspended above the substrate surface, and a stress-release mechanism (204) disposed on the electrode second portion, the stress-release mechanism (204) including a first slot (208) integrally formed in the electrode. In another exemplary embodiment, the substrate (106) includes an anchor (134, 136) and the stress-release mechanism 222 is formed adjacent the anchor (134, 136).

9 Claims, 4 Drawing Sheets

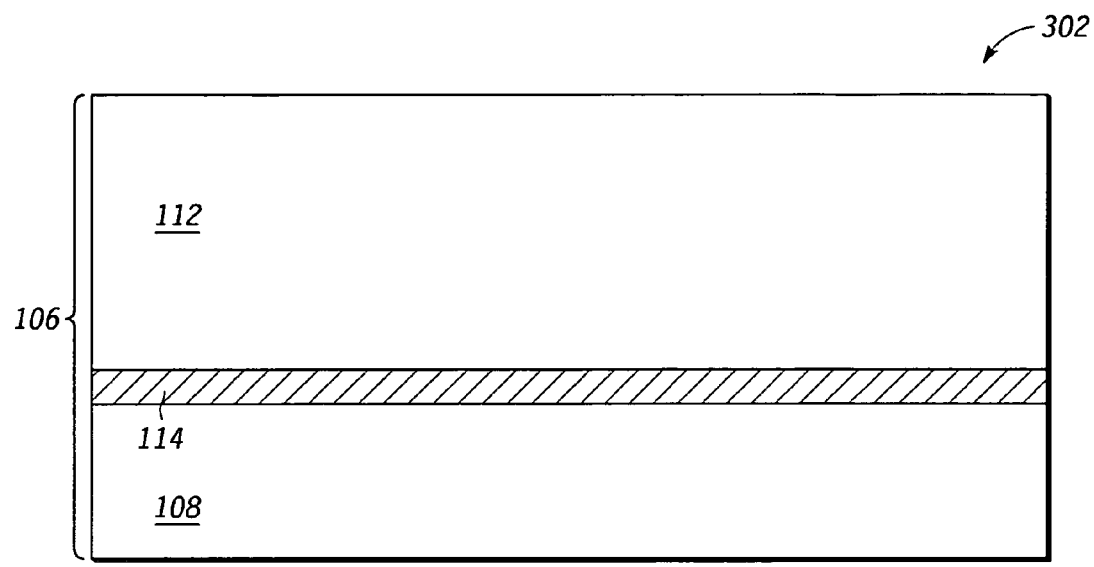
FIG. 3
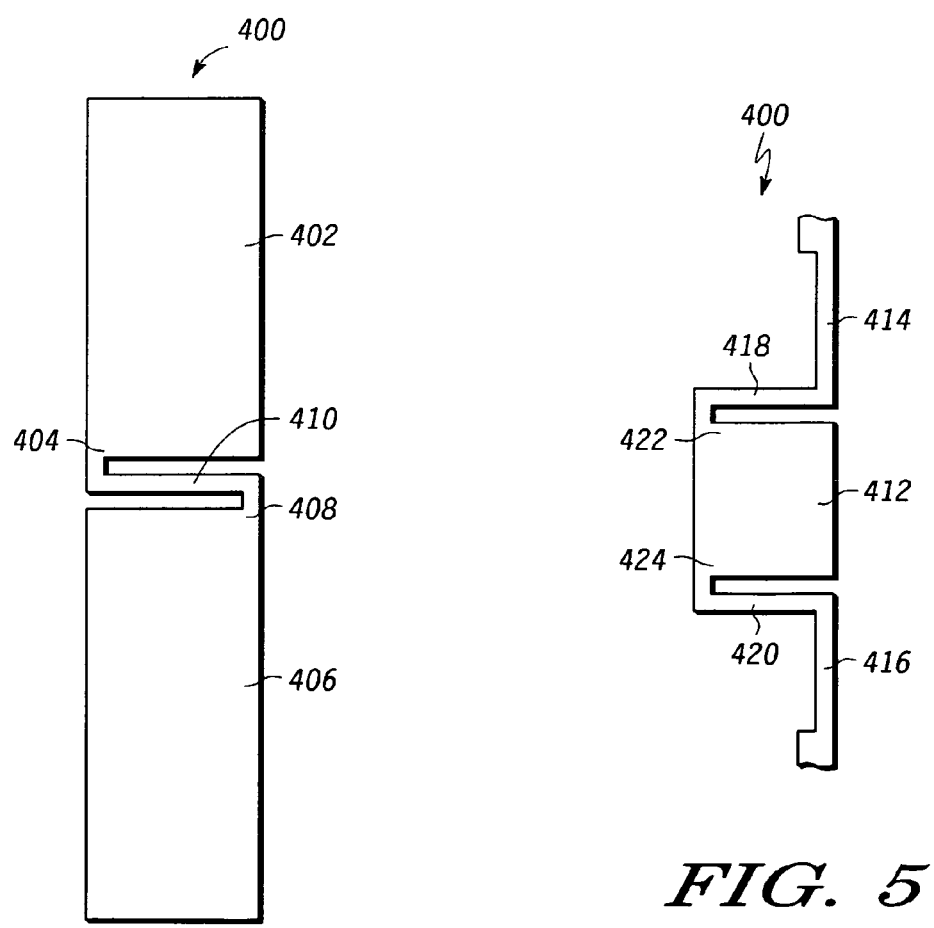
FIG. 4
FIG. 5

US 7,268,463 B2

STRESS RELEASE MECHANISM IN MEMS DEVICE AND METHOD OF MAKING SAME

FIELD OF THE INVENTION

The present invention generally relates to micro-electromechanical systems ("MEMS"), and more particularly relates to a stress release mechanism for use on an electrode or anchor of a MEMS device.

BACKGROUND OF THE INVENTION

Many devices and systems include a number of different types of sensors that perform various monitoring and/or control functions. Advancements in micromachining and other microfabrication processes have enabled the manufacturing of a wide variety of micro-electromechanical systems (MEMS). In recent years, many of the sensors that are used to perform monitoring and/or control functions have been implemented into MEMS devices.

One particular type of MEMS device is an accelerometer. A MEMS accelerometer may be formed in a silicon-on-insulator ("SOI") wafer that includes a handle layer, an insulating sacrificial layer comprising oxide overlying the handle layer, and an active layer overlying the insulating layer. The SOI MEMS accelerometer typically includes a proof mass that is formed in the active layer. A portion of the proof mass may be anchored to a section of the wafer via a portion of the insulating layer, while another portion of the proof mass may be suspended over the wafer, usually via a set of compliant beam springs. The proof mass moves when the MEMS accelerometer experiences acceleration, and the movement is converted via electronics into a signal having a parameter magnitude (e.g. voltage, current, frequency, etc.) that is dependent on the acceleration.

Typically, a MEMS sensor is subjected to rigorous testing before being shipped to a customer. The testing may include dropping the sensor from a predetermined height. This test simulates a mechanical shock that may be experienced when the customer handles the device. In most cases, currently configured MEMS sensors are sufficiently robust to withstand such a drop test. However, in other cases, the test may damage the MEMS sensor. In particular, the portion of the proof mass that is anchored to the wafer may become separated from the handle wafer. As a result, the MEMS sensor may become inoperable.

Accordingly, it is desirable to provide a MEMS sensor that is sufficiently robust to withstand stresses that may be applied thereto. In addition, it is desirable to have a simple and relatively inexpensive process for manufacturing the desired MEMS sensor that does not require additional equipment or processes. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements.

FIG. 3 is a cross-sectional view of an exemplary substrate that may be used to manufacture the SOI MEMS sensor depicted in FIGS. 1 and 2;

FIG. 4 is a top view of a portion of an exemplary pattern that may be formed over the substrate of FIG. 3;

FIG. 5 is a top view of another portion of the exemplary pattern that may be formed over the substrate of FIG. 3;

DETAILED DESCRIPTION OF THE INVENTION

The following detailed description is merely exemplary in nature and is not intended to limit the invention or the application and uses of the invention. Additionally, although the invention is described herein as being implemented into a silicon-on-insulator wafer, it will be appreciated that the invention may alternatively be implemented into any other suitable types of wafers. Furthermore, there is no intention to be bound by any expressed or implied theory presented in the preceding technical field, background, brief summary or the following detailed description. In this regard, although the invention is depicted and described in the context of an accelerometer, it will be appreciated that the invention at least could be used for any one of numerous devices that include a proof mass movably suspended above a substrate surface.

Figure 1:
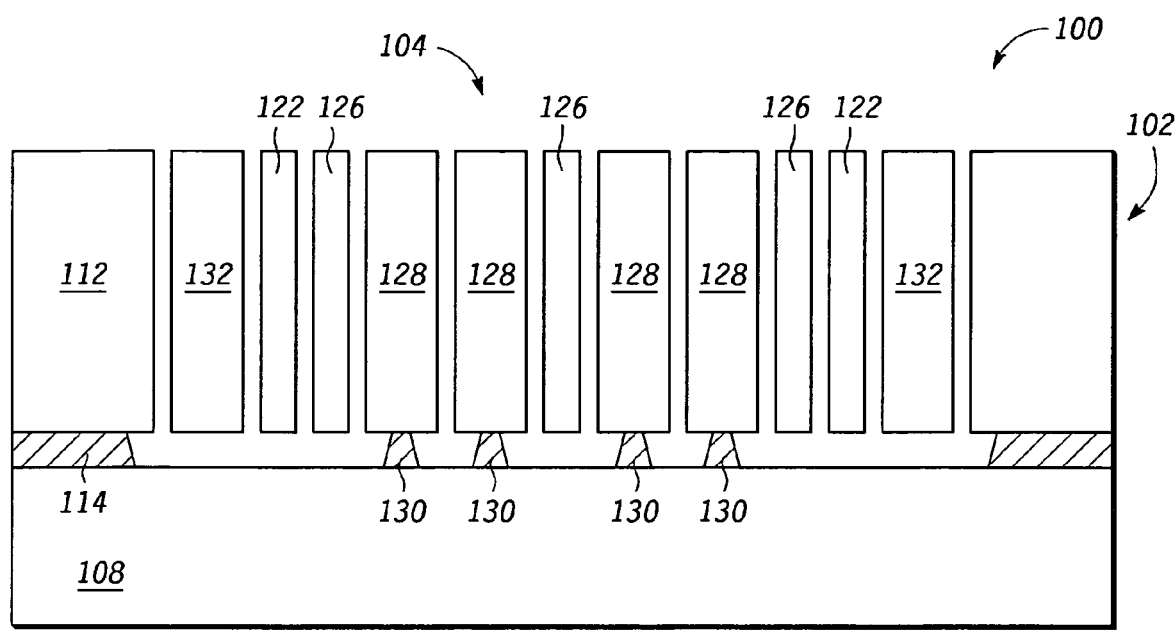
FIG. 1 is a cross-sectional view of an exemplary SOI MEMS sensor.

Turning now to the description, FIG. 1 is a cross-sectional view of an exemplary micro-electromechanical system (MEMS) device 100. The MEMS device 100 is an inertial sensor, such as an accelerometer, and includes an anchor region 102 and a sensor region 104 formed on a wafer 106. The wafer 106 may be any one of numerous types of conventionally-used wafers. For example, and as depicted in FIG. 1, the wafer 106 may be an SOI ("silicon-on-insulator") wafer. In such case, the wafer 106 generally includes a handle layer 108, an active layer 112, and an insulating layer 114 disposed between the handle layer 108 and the active layer 112. The anchor region 102 and sensor region 104 are both formed in the active layer 112. The anchor region 102 is a region of the active layer 112 that remains affixed to handle layer 108, via the insulating layer 114. Conversely, the sensor region 104, while being coupled to the anchor region 102, is also partially released from the handle layer 108. In particular, the sensor region 104 is partially undercut by removing portions of the insulating layer 114 below the sensor region 104. This undercut forms a release trench 116 that releases portions of the sensor region 104 from the handle layer 108. The released portions of the sensor region 104 are thus suspended above the handle layer 108.

The sensor region 104 includes a plurality of sensor elements, which may vary depending, for example, on the particular MEMS device 100 being implemented. However, in the depicted embodiment, in which the MEMS device 100 is an accelerometer, the sensor elements include suspension springs 122, at least one moving electrode 126, and at least one fixed electrode 128. The suspension springs 122 resiliently suspend the moving electrode 126 above the handle layer 108 and are preferably configured to be relatively flexible. The suspension springs 122 and moving electrode 126 each overlie the release trench 116 and are thus released from, and suspended above, the handle layer 108. The fixed electrodes 128, however, remain affixed to the wafer 106 via, for example, anchors 130 formed in, or from, the insulating layer 114.

For clarity and ease of illustration, it will be appreciated that the sensor region 104 is depicted in FIG. 1 to include two suspension springs 122, two moving electrodes 126, and four fixed electrodes 128. However, in a particular physical implementation, which is shown more clearly in FIG. 2, and which will now be described in more detail, the sensor region 104 includes a four suspension springs 122, a plurality of moving electrodes 126, and a plurality of fixed electrodes 128. Shield members 132 are adjacent to the suspension springs 122 and remain affixed to the substrate 106 via end anchors 134 and mid-section spring anchors 136. The end anchors 134 and mid-section spring anchors 136 are each formed in, or from the active layer 112 and are affixed to the wafer 106 via the insulating layer 114.

The suspension springs 122 are each coupled between the shield member 132 and the moving electrodes 126 and, as was previously noted, resiliently suspend the moving electrodes 126, when released, above the handle layer 108. As FIG. 2 also shows, the moving electrodes 126 are each disposed between fixed electrodes 128. The fixed electrodes 128, as was noted above, are not released. Rather, the fixed electrodes 128 remain anchored to the wafer 106, via a plurality of electrode anchors 130 (shown in FIG. 1).

Figure 2:
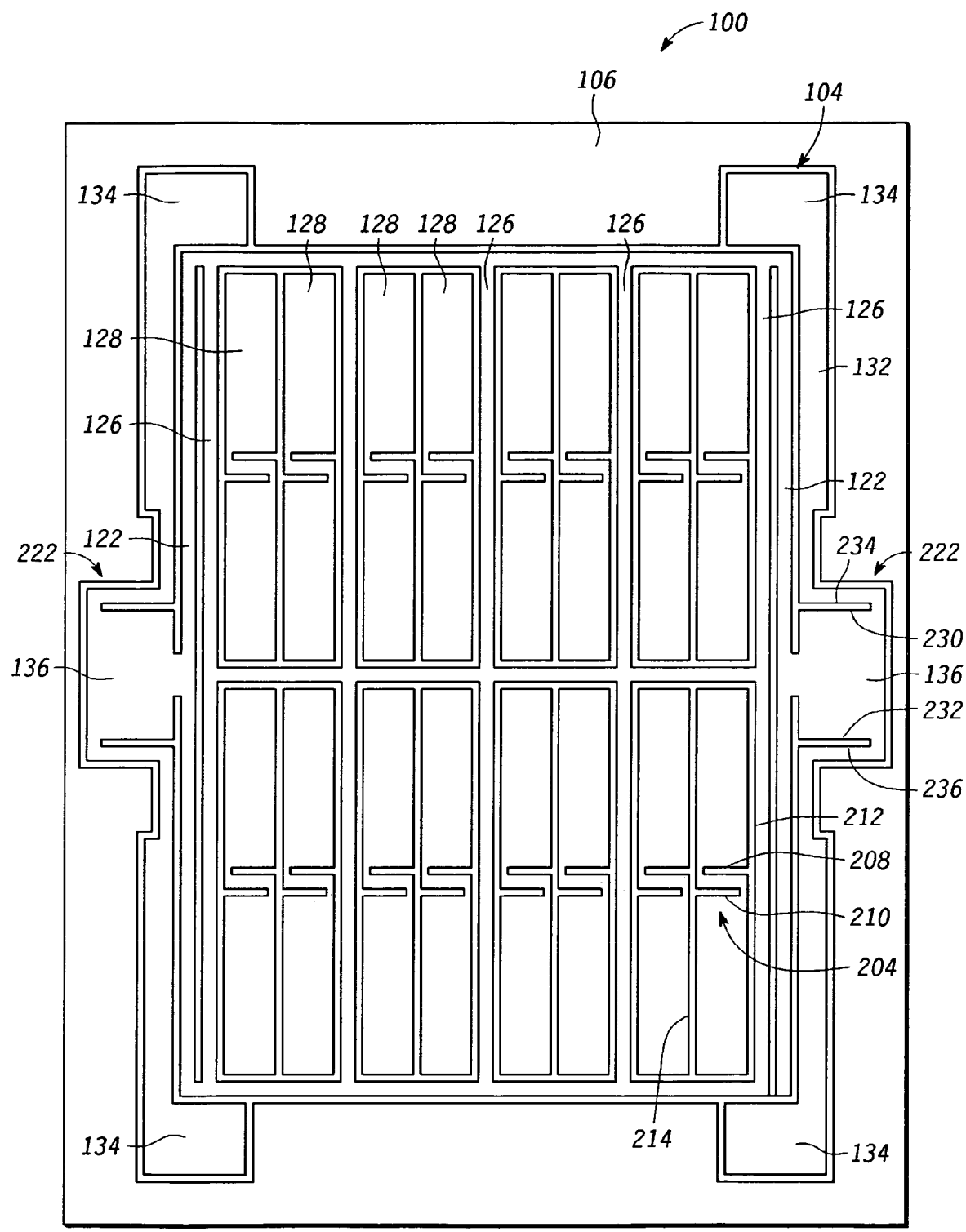
FIG. 2 is a top view of the exemplary SOI MEMS sensor depicted in FIG. 1.
Figure 6:
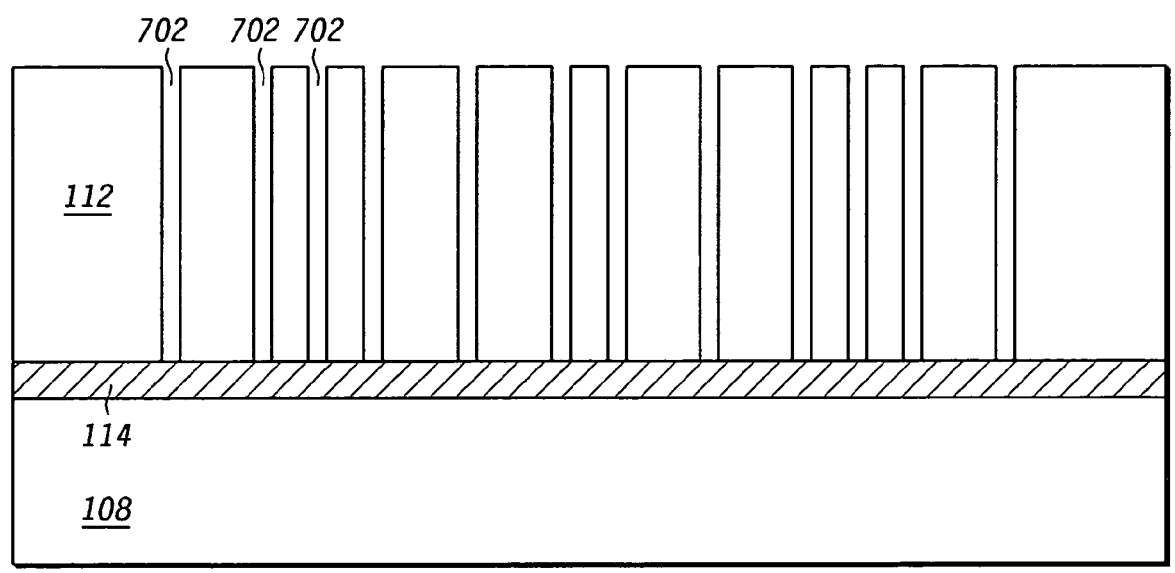
FIG. 6 is a cross-sectional view of the exemplary substrate of FIG. 3 during a step of the method for manufacturing the SOI MEMS sensor depicted in FIGS. 1 and 2.

The MEMS device 100 illustrated in FIGS. 1 and 2 is implemented as a capacitive type accelerometer. Thus, when the MEMS device 100 experiences an acceleration, the moving electrodes 126 will move a distance relative to the fixed electrode 128 that is proportional to the magnitude of the acceleration being experienced. The moving electrodes 126 and the fixed electrodes 128 together form a variable differential capacitor. Accordingly, when the MEMS device 100 experiences an acceleration, the moving electrodes 126 may move toward or away from a given fixed electrode 128. The distance that the moving electrodes 126 move will result in a change in capacitance between the fixed electrodes 128 and the moving electrodes 126. This change in capacitance may be measured and used to determine the magnitude of the acceleration.

To relieve stress that may be experienced by the end anchors 134, the mid-section spring anchors 136, and the fixed electrodes 128, stress release mechanisms 204, 222 may be included. The stress release mechanisms 204, 222 each include slots that are preferably formed in a MEMS device 100 component and are disposed substantially perpendicular to a force component that may be received by the MEMS device 100 component. In one exemplary embodiment, an electrode stress release mechanism 204 is integrally formed in one or more of the fixed electrodes 128 and includes two slots 208 and 210 that extend substantially vertically through the fixed electrode 128 to form an S-shape therein. For example, as shown in FIG. 2, the first slot 208 extends from a first side 212 of the fixed electrode 128 at least partially to a second side 214 of the fixed electrode 128, and the second slot 210 extends from the electrode second side 214 at least partially to the electrode first side 212. In FIG. 2, all of the fixed electrodes 128 are depicted as including an electrode stress release mechanism 204; however, it will be appreciated that multiples of such stress release mechanics may alternatively be included in a fixed electrode 128 or in other embodiments, the stress release mechanisms 204 may be included in only some of the fixed electrodes 128.

In another exemplary embodiment, a bi-directionally connected anchor stress release mechanism 222 is formed in the middle spring anchors 136. In such case, the anchor 136 includes a first side 230 and a second side 232 that is opposite from the first side 230. A first slot 234 is formed proximate the mid-section anchor first side 230, and a second slot 236 is formed proximate the mid-section anchor second side 232.

It will be appreciated that although one or two slots are incorporated as part of the stress release mechanisms 204, 222 fewer or more slots may alternatively be included. Moreover, it will be appreciated that the stress release mechanisms 204, 222 may be incorporated into any other section of the sensor 100 that may require stress relief.

Having described an embodiment of a MEMS device 100 from a structural standpoint, a particular preferred process of forming the described MEMS device 100 will now be described. In doing so reference should be made, as appropriate, to FIGS. 3-6. It will be appreciated that, for clarity and ease of explanation, the process will be depicted and described using a simplified cross section view, similar to that shown in FIG. 1. However, it will be further appreciated that the process is applicable to the actual physical MEMS device 100 illustrated in FIG. 2 and described above, as well as any one of numerous other MEMS sensors that may be implemented. It will additionally be appreciated that although the method is, for convenience, described using a particular order of steps, the method could also be performed in a different order or using different types of steps than what is described below.

With the above background in mind, and with reference first to FIG. 3, it is seen that the preferred starting material 302 for the process is an SOI wafer 106. Alternatively, the starting material 302 may be any one of numerous other articles including articles with a handle layer 108, an active layer 112, and an interposed insulating layer 114. No matter the specific type of starting material, the handle layer 108 and the active layer 112 are each preferably made of silicon, though it will be appreciated that these layers could be made of other materials. It will be appreciated that the active layer 112 may be, for example, single crystal or polycrystalline silicon, or any other material from which the MEMS sensor elements may be formed. The insulating layer 114 is preferably made of a material, such as silicon oxide, doped oxide, and doped silicate glass, just to name a few, that can be readily etched to release at least some of the sensor elements from the handle layer 108. It will be appreciated that the starting material 302 may include the handle layer 108, the active layer 112, and the insulating layer 114 when obtained, or one or more of these layers may be formed as part of the overall process.

Having obtained (or prepared) the starting material 302, the active layer 112 is then patterned and etched to define the anchor region 102 and the sensor region 104 therein. It will be appreciated that any one of numerous suitable techniques for patterning and etching may be employed. In one exemplary embodiment, a protective layer is formed over the active layer 112. For example, a protective material may be deposited over the active layer 112 in its entirety and a desired pattern is developed or etched into the protective material. In another exemplary embodiment, a shadowmask having an outline of the desired pattern is placed over the active layer 112 and the protective material is deposited over the mask and active layer 112. When the shadowmask is removed, the remaining protective material is disposed over the active layer 112 in the desired pattern.

The desired pattern may be any appropriate pattern for forming the MEMS device 100 including stress release mechanisms 204, 222. A portion of an exemplary pattern 400 is depicted in FIG. 4. The pattern 400 includes a first electrode section 402 having a corner 404, a second electrode section 406 including a corner 408, and a strip 410. The corner 404 of the first electrode section 402 is preferably located diagonally from the corner 408 of the second electrode section 406 and the strip 410 couples the first and second electrode sections 402 and 406 to each other via the corners 404 and 408. Accordingly, the first electrode section 402, the strip 410, and the second electrode section 406 form an S-shape. The strip 410 is preferably sufficiently narrow to allow relative motion between electrode sections 402 and 406. Although only two pairs of electrode sections 402 and 406 are depicted, it will be appreciated that the pattern 400 may include a plurality of electrode sections for the formation of multiple fixed electrodes 128 on the device 100. It will be appreciated that the desired pattern is preferably formed over a section of the active layer 112 in which the electrode stress release mechanism 204 is to be formed.

Another portion of the exemplary pattern 400 is shown in FIG. 5. This portion of the pattern 400 includes an anchor section 412, a first connecting section 414, a second connecting section 416, and two strips 418, 420. The anchor section 412 includes two adjacent corners 422, 424 to which an end of each strip 418, 420 is attached. Extending from the other end of the strips 418, 420 are the first and second connecting sections 414, 416. It will be appreciated that this portion of the pattern is preferably formed over a section of the active layer 112 in which the bi-directionally connected anchor stress release mechanism 222 is to be formed.

After the desired pattern 400 is formed over the active layer 112, the material not protected by the protective material is removed. This step may be performed using any one of numerous techniques; however, in a preferred embodiment, a reactive ion etch (RIE) process is used. Regardless the specific process that is used, it results in a plurality of trenches 702 being formed in the sensor region 104, which define the structural features of the individual sensor elements, as FIG. 7 furthers shows. Regardless of the specific location, the trenches 702 each provide access to the insulating layer 114, whereby the release of a portion of the sensor region 104 is effected. The size and number of trenches 702, both in and between the sensor elements, are at least partially selected to implement the desired sequence and/or timing of the release of the sensor elements. Moreover, the number and spacing of the etch openings are selected to achieve, among other things, desired response characteristics.

Next, those portions of the sensor region 104 that are formed may be undercut and released using a sacrificial etch process. In such case, chemical etching (e.g. an isotropic dry or wet etch) may be used. Preferably, the process laterally etches at least a portion of the insulating layer 114 to thereby release the suspension springs 122 and moving electrodes 126 from the wafer 106 and to form the MEMS device 100 shown in FIG. 1.

As was previously noted, although the above-described MEMS devices 100 is an accelerometer, the manufacturing process described herein is not limited to accelerometers or any other type of sensor. It is applicable to any one of numerous MEMS devices that include some type of structure that is resiliently suspended by one or more springs. Non-limiting examples of such devices include various types of gyroscopes and switches.

MEMS devices and methods for forming the devices have now been provided. In one exemplary embodiment, the MEMS device comprises a substrate having a surface, an electrode having a first portion coupled to the substrate surface, and a second portion movably suspended above the substrate surface, and a stress-release mechanism disposed on the electrode second portion, the stress-release mechanism including a first slot integrally formed in the electrode. In another embodiment of the device, the electrode includes a first side and a second side and the first slot extends from the electrode first side at least partially to the electrode second side. In still another embodiment of the device, the stress-release mechanism comprises a second slot integrally formed in the electrode. In yet another embodiment of the device, the second slot extends from the electrode second side at least partially to the electrode first side.

In another embodiment of the device, the substrate comprises an insulating layer and an active layer disposed over the insulating layer, and the electrode is formed in the active layer. Alternatively, the electrode includes a third portion coupled to the substrate surface, and the electrode second portion is disposed between the first and third portions. In yet another embodiment, the stress-release mechanism is formed adjacent to the electrode first portion.

In another exemplary embodiment, the MEMS device comprises a substrate having a surface, an anchor at least partially coupled to the substrate surface, and a stress-release mechanism coupled to the anchor, the stress-release mechanism including a first slot integrally formed adjacent the anchor. In another embodiment, the anchor includes a first side and a second side opposite the first side, and the first slot is formed proximate the anchor first side. In still another embodiment, the stress release mechanism includes a second slot, the second slot formed proximate the anchor second side.

In still yet another embodiment, a method is provided for forming a micro-electromechanical ("MEMS") device from a substrate comprising an insulating layer and an active layer overlying the insulating layer. In one exemplary embodiment, the method includes the steps of forming a protective layer over the active layer in a pattern, the pattern having at least a first electrode section having a corner, a second electrode section adjacent the first electrode section and having an corner disposed diagonally from the first electrode section corner, and a strip connecting the first and second electrode section corners, and removing material from portions of the active layer and the insulating layer over which the protective layer is not formed to thereby form an electrode having a slot formed therein. Alternatively, the first electrode section has a side and the second electrode section has a side substantially parallel to the first electrode section side and at least a portion of the strip is substantially parallel to the first and second electrode section sides. Alternatively, the step of forming comprises placing a shadowmask having an outline of the pattern over the active layer. In another alternate embodiment, the step of forming comprises depositing the protective material over the surface of the active layer, and etching the pattern into the deposited protective material. In still another embodiment, the method further comprises etching a portion of the insulating layer beneath the first electrode portion to thereby release at least a portion of the first electrode from the substrate.

In another embodiment, a method is provided for forming a MEMS device from a substrate comprising an insulating layer and an active layer overlying the insulating layer, where the method includes the steps of forming a protective layer over the active layer in a pattern, the pattern having at least an anchor section having a first corner and a strip extending from the anchor section first corner, and removing material from portions of the active layer and the insulating layer over which the protective layer is not formed to thereby form an anchor having a slot formed therein. In another embodiment, the anchor section further comprises a second corner adjacent the first corner and the pattern further comprises a second strip extending from the anchor section second corner. In still another embodiment, the step of forming comprises placing a shadowmask having an outline of the pattern over the active layer.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A MEMS device comprising:
   a substrate having a surface;
   a fixed electrode at least partially anchored to the substrate surface, said fixed electrode having a first side, a second side, and a midline intermediate the first side and the second side;
   a movable electrode movably suspended above the substrate surface; and
   a stress-release mechanism disposed on the fixed electrode including a first slot extending through the first side, past the midline, and partially toward the second side.

2. The MEMS device of claim 1, wherein the stress-release mechanism comprises a second slot integrally formed in the fixed electrode, the second slot extending through the second side, past the midline, and partially toward the first side.

3. The MEMS device of claim 2, wherein the first slot and the second slot cooperate to define an S-shaped portion of the fixed electrode.

4. The MEMS device of claim 1, wherein:
   the substrate comprises an insulating layer and an active layer disposed over the insulating layer; and
   the fixed electrode is formed in the active layer.

5. A method of forming a micro-electromechanical ("MEMS") device from a substrate comprising an insulating layer and an active layer overlying the insulating layer, the method comprising the steps of:
   forming a protective layer over the active layer in a pattern, the pattern having at least a first electrode section having a corner, a second electrode section adjacent the first electrode section and having an corner disposed diagonally from the first electrode section corner, and a strip connecting the first and second electrode section corners, the strip defined by first and second slots extending into the pattern; and removing material from portions of the active layer and the insulating layer over which the protective layer is not formed to thereby form an electrode having a slot formed therein.

6. The method of claim 5, wherein the first electrode section has a side and the second electrode section has a side substantially parallel to the first electrode section side and at least a portion of the strip is substantially parallel to the first and second electrode section sides.

7. The method of claim 5, wherein the step of forming comprises placing a shadowmask having an outline of the pattern over the active layer.

8. The method of claim 5, wherein the step of forming comprises:
   depositing the protective material over the surface of the active layer; and
   etching the pattern into the deposited protective material.

9. The method of claim 5, further comprising etching a portion of the insulating layer beneath the first electrode portion to thereby release at least a portion of the first electrode from the substrate.

* * * * *